United States Patent [19]

Liebman et al.

[11] Patent Number: 5,469,073
[45] Date of Patent: Nov. 21, 1995

[54] METHOD AND APPARATUS FOR ULTRASONICALLY ENERGIZING PIN SEATING IN TEST FIXTURE DEVICES

[75] Inventors: Henry F. Liebman, Tamarac; Alan Clayton, Wilton Manors; Walter A. Horneman, Plantation, all of Fla.

[73] Assignee: Motorola, Inc., Schaumburg, Ill.

[21] Appl. No.: 271,318

[22] Filed: Jul. 6, 1994

[51] Int. Cl.⁶ ............................ G01R 1/04; G01R 1/073
[52] U.S. Cl. ..................... 324/757; 324/72.5; 324/73.1
[58] Field of Search ................................. 324/754, 758, 324/760, 72.5, 73.1, 757

[56] References Cited

U.S. PATENT DOCUMENTS 4,820,976  4/1989  Brown ................................ 324/72.5
5,369,358  11/1994  Metzger et al. ...................... 324/754

Primary Examiner—Kenneth A. Wieder
Assistant Examiner—Barry C. Bowser
Attorney, Agent, or Firm—Frank M. Scutch, III

[57]    ABSTRACT

A device (100) for use in a test fixture system which uses a plurality of ultrasonic transducers (103,105,107) to transfer energy to a plurality of contact probes (109). The ultrasonic energy enables the pins (111) to pierce and move obstructing materials to insure adequate electrical contact between the contact probe and an electrical connector on a device under test.

10 Claims, 1 Drawing Sheet

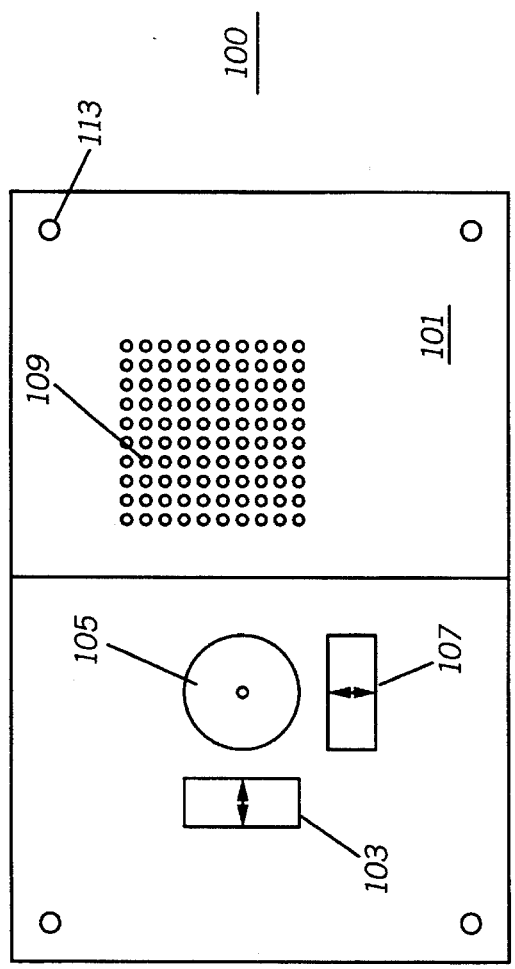
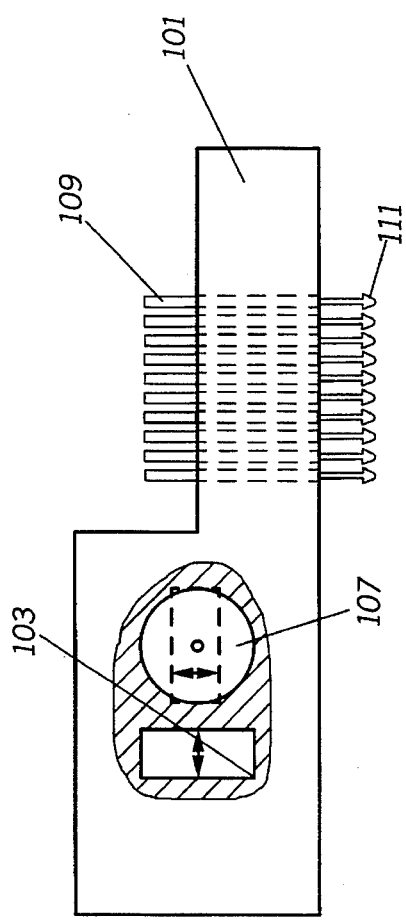

5,469,073

METHOD AND APPARATUS FOR ULTRASONICALLY ENERGIZING PIN SEATING IN TEST FIXTURE DEVICES

TECHNICAL FIELD

This invention relates in general to electronic test fixtures and more specifically to a means and method of insuring adequate contact between a test fixture and an electronic device.

BACKGROUND

When manufacturing high volumes of discrete components, circuit devices or electronic equipment it is often desirous to utilize a test fixture. The test fixture is used to hold the device while rapidly performing any number of tests to determine its proper operation. In the event the test fixture determines some malfunction, the device can then be discarded or removed for repair.

The test fixture structure may take on many overall forms but often includes a number of test pins which mate with corresponding pads or pins on the device under test. To enable the test fixture to operate properly and give correct test data, it is imperative that each of the pins on the test fixture and device's test area mate properly to form a good electrical connection. Even though a variety of pin types are utilized in the industry, these most often only provide about a 98% reliability. This figure however is inadequate when dealing with high manufacturing volumes. Too many devices would be tested with an improper connection giving erroneous data, high scrap and retest costs.

One problem associated with this type of test structure is many of the devices which are under test include rosin, rubber, plastic, organic or other protective material which cover the device's test contact points. These materials are flux residue's from the soldering process or are intended to shield the device to prevent aging. Problems arise when the device is inserted into the test fixture and these coating materials prevent or inhibit a good electrical connect. In turn, the test fixture then gives faulty indications and test data. This ultimately leads to the device being discarded, retested or repaired when in fact it had no defects. Thus, one of the faults associated with the test fixture is that it does not consistently make adequate electrical contact between test fixture and test device. This causes a high reject rate and product expense only to determine the device is operational.

Therefore, it was realized that the need exists to provide a means to insure highly reliable contact between the test fixture and the device test area without being difficult or cumbersome to use. The test device should be capable of easy installation into the test fixture without added interference to other contact's or test pins.

BRIEF DESCRIPTION OF THE DRAWINGS

FIG. 1 is a top view showing the ultrasonic test fixture system used in the present invention.

FIG. 2 is a side view with partial cut-away showing the ultrasonic transducer assembly and contacting probes used in the invention.

DETAILED DESCRIPTION OF THE PREFERRED EMBODIMENT

Referring now to FIG. 1 and FIG. 2, the test fixture housing assembly is shown generally at 100 and includes a housing plate 101 which is used to fasten both a plurality of ultrasonic transducer assemblies 103, 105 and 107 and a plurality of contacting probes 109. As best seen in FIG. 1, each of the ultrasonic transducer assemblies 103, 105 and 107 may be relatively small in size and although are shown cylindrical in appearance may shaped in any configuration to emit energy in one plane. Thus, three assemblies may be used to emit ultrasonic energy three dimensionally, in each of X, Y and Z planes. As seen in the partial cutaway view in FIG. 2, each of the transducer assemblies 103, 105 and 107 are embedded in the housing plate 101. In one embodiment of the invention, a mechanical clamp or epoxy may be used to securely fasten each of the transducers into the housing plate material. This insures that each of the transducers physically move housing plate 101 itself, and do not move independently within housing plate 101.

Also securely fastened within the housing plate 101 are contact probes 109. Each of contact probes 109 are frictionally engaged within housing plate 101 and include a contact edge 111, which may be single pointed, chisel shaped, castelated, multi-pointed or the like. Contact probes 109 protrude at both ends through the housing plate 101. The contact probes 109 are used to contact the surface area attached to an electrical device under test. The surface area may contain a corresponding test connector or other similar device. Finally, the housing plate includes a plurality of apertures 113 used to align the device under test to contact probes 109 and secure the housing plate 101 to the test fixture (not shown).

In operation, an electronic device which is to be tested is inserted into a test fixture. An electrical test area within the device makes connection with each of contact probes 109. In order to insure that an adequate connection is established, each of ultrasonic transducers 103, 105 and 107 are activated and swept in frequency either for either a predetermined time or the duration of the test cycle. A variable or fixed amplitude may be used. Ultrasonic energy emitted by transducers 103, 105 and 107 is transferred through housing plate 101 to produce corresponding vibrations to contacting probes 109. This enables the contact probes 109 to pierce and/or move any obstructing materials which may be present between the probes and electrical test area. This insures a good electrical connection which ultimately gives reliable test data when using a test fixture. The frequency of the ultrasonic transducer is swept and/or varied in amplitude to provide the maximum movement and energy transfer through contract probes 109 to deflect a greater amount of obstructing material. The more energy which is transferred through the probes the greater the amount of material which can be shifted and/or moved to provide electrical contact.

A single transducer in one plane may accomplish the desired effect, but three transducers are shown for clarity.

It should also be recognized by those skilled in the art that although the present invention is described using an electrical device the invention also has application for insuring adequate contact for mechanical devices which are tested within a test fixture. When using the device in a mechanical application, a single ultrasonic transducer may be used provided a satisfactory result is attained.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An ultrasonic test assembly used with an electronic test fixture system comprising:

a plurality of ultrasonic transducers fixedly attached to a substrate; and a plurality of elongated movable test probes projecting through said substrate, said test probes moving substantially circularly to a test area on a device under test, in accordance with energy produced by said plurality of ultrasonic transducers, to pierce obstructing materials thereby insuring electrical contact between said probes and said device under test.

2. A method of insuring electrical contact between at least one test probe in an electrical test fixture and an electrical test area used with a device under test which includes obstructing material comprising the steps of:

inserting an electrical device into a test area within a test fixture;

positioning said electrical test fixture so said at least one test probe is in contact with said test area;

inducing said at least one test probe with ultrasonic energy to produce a substantially circular vibration in said at least one probe; and sustaining said vibration until said at least one test probe displaces said obstruction and is in intimate contact with said test area.

3. A method described in claim 2 wherein said inducing step further includes producing said vibrations in an X, Y and Z plane.

4. A method described in claim 2 further including the step of varying the amplitude of said ultrasonic energy for displacing greater amounts of said obstructing material.

5. A method described in claim 2 wherein said obstructing materials includes any one of the group of rosin, rubber, plastic or organic.

6. An apparatus for use with a test fixture system comprising:

a housing;

at least one ultrasonic transducer fixedly attached to the housing for providing movement in response to ultrasonic energy produced therefrom;

at least one contact probe fixedly attached to the housing for providing contact with a test point on a device under test, the contact probe moving in accordance with the ultrasonic energy produced by the at least one ultrasonic transducer in a direction substantially circular to the test point to pierce obstructing material in the path of the at least one contact probe.

7. An apparatus according to claim 6 wherein the at least one ultrasonic transducer is positioned to provide movement to the at least one contact probe in either an X, Y, or Z plane.

8. An apparatus according to claim 6 wherein the at least one contact probe include a pointed conductive tip for enhancing movement through the obstructing material.

9. An apparatus according to claim 6 wherein the at least one probe is arranged in a predetermined position for making electrical contact with the test point.

10. An apparatus according to claim 6 further comprising:

a clamp for fastening the at least one transducer to the housing.

* * * * *